United States Patent [19]

Sekine

[11] Patent Number: 5,793,071
[45] Date of Patent: Aug. 11, 1998

[54] SOLID-STATE IMAGING DEVICE

[75] Inventor: Hirokazu Sekine, Fujisawa, Japan

[73] Assignee: Kabushiki Kaisha Toshiba, Kawasaki, Japan

[21] Appl. No.: 720,059

[22] Filed: Sep. 27, 1996

[51] Int. Cl.$^6$ .................. H01L 27/148; H01L 29/768
[52] U.S. Cl. .................................. 257/240; 257/241
[58] Field of Search .............................. 257/240, 241

[56] References Cited

U.S. PATENT DOCUMENTS

| | | |
|---|---|---|
| 4,012,587 | 3/1977 | Ochi et al. |
| 4,336,556 | 6/1982 | Sekine et al. |
| 4,602,289 | 7/1986 | Sekine ................. 257/240 |

FOREIGN PATENT DOCUMENTS

| | | | |
|---|---|---|---|
| 3021470 | 9/1983 | European Pat. Off. | |
| 58-88976 | 5/1983 | Japan | 257/240 |
| 59-44870 | 3/1984 | Japan | 257/240 |
| 60-187187 | 9/1985 | Japan | 257/240 |

*Primary Examiner*—Ngan V. Ngo
*Attorney, Agent, or Firm*—Finnegan, Henderson, Farabow, Garrett & Dunner, L.L.P.

[57] ABSTRACT

A solid-state imaging device used as a linear sensor of the TDI mode in which resolution is improved and moire phenomenon takes place to less degree. This solid-state imaging device comprises first pixel trains comprised of plural pixels, second pixel trains comprised of plural pixels disposed in the state respectively shifted by half pitches in the horizontal and vertical directions with respect to the first pixel trains, a charge storage section for storing signal charges transferred to a signal processing section, first shift electrodes disposed between respective corresponding pixels of the first and second pixel trains and adapted for sequentially transferring signal charges, and second shift electrodes for transferring signal charges of the pixels of the final transfer stage of the first and second pixel trains to the charge transfer section through a shift register and an output circuit. Preferably, the signal processing section includes an interpolating circuit for interpolating, on the basis of one of signal outputs from the first and second pixel trains, the other signal output.

9 Claims, 3 Drawing Sheets

FIG. 2B INVENTION

5,793,071

SOLID-STATE IMAGING DEVICE

BACKGROUND OF THE INVENTION

This invention relates to a semiconductor device constituting a linear sensor, and more particularly to a solid-state imaging (image pick-up) device used as a linear sensor of the TDI (Time Delay Integration) mode.

Initially, the fundamental principle of the linear sensor will be described. FIG. 3 shows the configuration of this linear sensor. In this figure, the lineal sensor comprises a pixel train 10 comprised of pixels 11 to 14, an electrode train 20 comprised of shift electrodes 21 to 24, a CCD shift register 3, and an output circuit 4. The pixels 11 to 14 are one-dimensionally arranged in a horizontal direction. The shift electrodes 21 to 24 are provided in a manner opposite to the pixels 11 to 14. The CCD shift register 3 is disposed along the shift electrodes 21 to 24. The output circuit 4 is disposed at the output end of the CCD shift register 3.

Charges of the pixels 11 to 14 stored by the photoelectric conversion are transferred to the CCD shift register 3 by the shift electrodes 21 to 24. Then, the charges which have been transferred to the CCD shift register 3 are transferred from the output circuit 4 to the external. During the charge transfer operation corresponding to one line in this CCD shift register 3, charge storage of the next line is carried out at the pixels 11 to 14.

Meanwhile, as the sensor of this kind, there is a linear sensor of the mode called "TDI mode" in which plural pixel trains are provided so that the sensitivity is improved. FIG. 4 shows the structure thereof. The linear sensor shown in FIG. 4 comprises a pixel train 50 comprised of pixels 51 to 54, a pixel train 70 comprised of pixels 71 to 74, a pixel train 90 comprised of pixels 91 to 94, a CCD shift register 11, an electrode train 60 comprised of shift electrodes 61 to 64 for transferring charges of the pixels 51 to 54 to the pixels 71 to 74, an electrode train 80 comprised of shift electrodes 81 to 84 for transferring charges of the pixels 71 to 74 to the pixels 91 to 94, an electrode train 100 comprised of shift electrodes 101 to 104 for transferring charges of the pixels 91 to 94 to the CCD shift register 11, and an output circuit 12 for transferring charges of the CCD shift register 11 to the external.

The actual operation in such a configuration is as follows. First, the shift electrodes (serving as a gate element) 101 to 104 are opened to transfer signal charge train of the pixels 91 to 94 to the CCD shift register 11 in which read-out operation of signals (signal charges) of one line has been completed. Then, the shift electrodes 101 to 104 are closed thereafter to open the shift electrodes 81 to 84 to transfer signal charge train of the pixels 71 to 74 to the pixels 91 to 94 thereafter to close the shift electrodes 81 to 84 and to open the shift electrodes 61 to 64 to transfer signal charge train of the pixels 51 to 54 to the pixels 71 to 74 thereafter to close the shift electrodes 61 to 64, thus to carry out the photoelectric conversion at the respective pixel trains.

The linear sensor of the TDI mode permits the photoelectric conversion time period to take a value three times, which corresponds to the number of pixel trains, longer (greater) than the single pixel train type linear sensor as described above. Thus, the sensitivity can be increased.

However, this conventional line sensor of the TDI mode has the following problems.

In this linear sensor, the pitch Ph0 in the horizontal direction is sum of the pixel width Wh and the device isolation width Gh. Namely, the relational expression described below holds:

Ph0=Wh+Gh

Accordingly, invalid area is produced by the device isolation width Gh.

On the other hand, the pitch Pv0 in the horizontal direction is sum of the pixel length Wv and the length of shift electrode Gv. Namely, the relational expression described below holds:

Pv0=Wv+Gv

Accordingly, in vertical direction, there exists invalid area by the length of shift electrode Gv.

In addition, since pixels constituting respective pixel trains are independent each other, in the case where an image of an object of longitudinal fringe to the same degree as that of the pixel pitch is incident in formation of image onto the pixel train, moire phenomenon takes place between the object image and the pixel train. Namely, there results repetitive pattern in a bead form in density. Thus, the picture quality might be deteriorated.

SUMMARY OF THE INVENTION

This invention has been made in view of the problems with the prior arts and its object is to provide a solid-state imaging device constituting a linear sensor of the TDI mode which prevents degradation in the degree of resolution by the device isolation area in the horizontal direction, and which reduces moire phenomenon.

To achieve the above-mentioned object, a solid-state imaging device of this invention comprises: first pixel trains each comprised of n number of pixels (n is integer more than 1); second pixel trains comprised of n number of pixels disposed in the state respectively shifted by half pitches in a horizontal direction and in a vertical direction with respect to the first pixel trains; a charge storage section for storing signal charges transferred to signal processing means; first shift electrodes disposed between the i-th corresponding pixels (i=1–n) of the first and second pixel trains and adapted for sequentially transferring signal charges produced therein; and second shift electrodes for transferring signal charges of the pixels of the final transfer stage of the first and second pixel trains to the charge storage section.

The charge storage section preferably have a capacity sufficient to store all of signal charges of both the first and second pixel trains.

Moreover, the charge storage section may comprise a first storage section for storing only signal charges corresponding to respective pixels constituting the first pixel train and a second storage section for storing only signal charges corresponding to respective pixels constituting the second pixel train.

Further, the solid-state imaging device may comprise a shift register for transferring signal charges stored in the charge storage section to an output section.

Furthermore, the signal processing means may carry out processing on the basis of signal charges transferred by the shift register.

In addition, the signal processing means may comprise interpolating means for interpolating, on the basis of any one of signal outputs from the first and second pixel trains, the other signal output.

BRIEF DESCRIPTION OF THE DRAWINGS

In the accompanying drawings:

FIG. 2A and 2B are model views showing the effect of this invention in a manner of comparison with the prior art;

DESCRIPTION OF THE PREFERRED EMBODIMENTS

Figure 1:
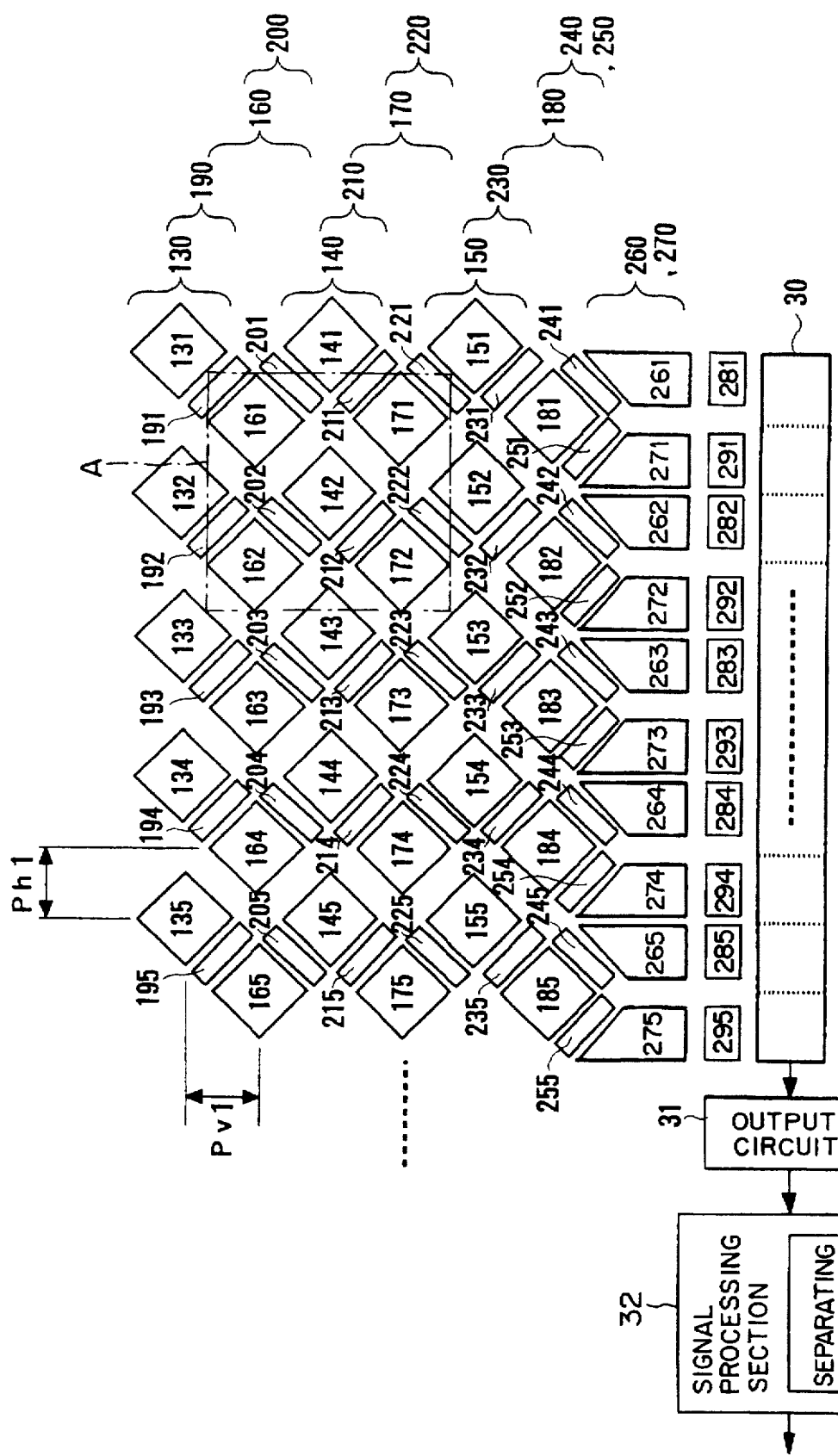
FIG. 1 is a model view showing the structure of a solid-state imaging device according to an embodiment of this invention.

Preferred embodiments of this invention will now be described with reference to the attached drawings. FIG. 1 shows the structure of a solid-state imaging device according to an embodiment of this invention. In the solid-state imaging device shown in this figure, a pixel train 130 comprised of pixels 131, 132 - - - , a pixel train 140 comprised of pixels 141, 142, - - - , and a pixel train 150 comprised of pixels 151, 152, - - - respectively correspond to the first pixel trains; and a pixel train 160 comprised of pixels 161, 162, - - - , a pixel train 170 comprised of pixels 171, 172, - - - , and a pixel train 180 comprised of pixels 181, 182, - - - respectively correspond to the second pixel trains. The first and second pixel trains are disposed in the state respectively shifted by half pitches in the horizontal direction and in the vertical direction. Namely, in this embodiment, the first and second pixel trains of three rows (three transfer stages) are provided in such a manner that they are arranged one after another.

A shift electrode train 190 comprised of shift electrodes 191, 192, - - - is provided between the pixel train 130 and the pixel train 160, and serves to carry out charge transfer from the former to the latter. Similarly, a shift electrode train 200 comprised of shift electrodes 201, 202, - - - is provided between the pixel train 160 and the pixel train 140; a shift electrode train 210 comprised of shift electrodes 211, 212, - - - is provided between the pixel train 140 and the pixel train 170; a shift electrode train 220 comprised of shift electrodes 221, 222, - - - is provided between the pixel train 170 and the pixel train 150; and a shift electrode train 230 comprised of shift electrodes 231, 232, - - - is provided between the pixel train 150 and the pixel train 180. In respective sets of pixel trains, those shift electrode trains serve to carry out charge transfer from the former (pixel train) to the latter (pixel train).

At the output side of the pixel train 180, a memory (charge storage) train 260 comprised of memories (charge storage elements) 261, 262, - - - and a memory (charge storage) train 270 comprised of memories (charge storage elements) 271, 272, - - - are disposed, wherein memories constituting two memory trains 260, 270 are respectively allocated to pixels 181, 182, - - - constituting the pixel train 180. A shift electrode train 240 comprised of shift electrodes 241, 242, - - - is provided between the pixel train 180 and the memory train 270, and serves to carry out charge transfer from the former to the latter. A shift electrode train 250 comprised of shift electrodes 251, 252, - - - is provided between the pixel train 180 and the memory train 260, and serves to carry out charge transfer from the former to the latter.

At the output side of the memory trains 260, 270, a shift register 30 is disposed. Between the memory train 260 and the shift register 30, a control (shift) electrode train 280 comprised of shift electrodes 281, 282, - - - is disposed. Between the memory train 270 and the shift register 30, a control (shift) electrode train 290 comprised of control (shift) electrodes 291, 292, - - - is disposed. Charges of the memory trains 260, 270 are transferred to the shift register 30 by the control (shift) electrode trains 280, 290. At the output side of the shift register 30, an output circuit 31 is disposed. By this output circuit 31, charges of the shift register 30 are serially outputted to a signal processing section 32 of the external. This signal processing section 32 includes a separating circuit 33 for separating any one of signal outputs of the first pixel trains, from other signal output of the second pixel trains using, for example a delay circuit. This separating circuit 33 serves to separate, e.g., an output of the first pixel train 140 by outputs of the second pixel trains 160, 170. At this time, in the case where attention is drawn to the pixel 142, e.g., the area A at the periphery of the pixel 142 and encompassed by single dotted lines is the area to be interpolated. In this case, signals (signal charges) of respective second pixels 161, 162, 172, 171 adjacent to four sides of the pixel 142 are used to compensate insufficiency of the signal (signal charge) of the pixel 142.

The operation of the linear sensor of the TDI mode thus constituted will now be described. Signal charges stored in the pixel trains 130, 160 produced in correspondence with a signal output of 1 line of the object are transferred to the pixel trains 140, 170 adjacent thereto, at which photoelectric conversion corresponding to the signal output of the same line of the object is carried out. Thereafter, the signal charges stored in the pixel trains 140, 170 are transferred to the pixel trains 150, 180 adjacent thereto, at which photoelectric conversion corresponding to the signal output of the same line of the object is carried out. Then, the signal charges of the pixel trains 150, 180 are transferred to the memory trains 260, 270. Subsequently, these signal charges are transferred from the memory trains 260, 270 to the shift register 30. Then, the shift register 30 is caused to be operative to serially output signal charges from the output circuit 31 to the external. Since plural kinds of pixel trains are arranged in the state respectively shifted by half pitches in the horizontal and vertical directions and are caused to carry out a series of transfer operations up to the shift register 30 in a manner related to each other, the first and second pixel trains are interpolated with each other so that resolution in the horizontal direction can be improved.

Similarly to the ordinary linear sensor of the TDI mode, also in the linear sensor of the TDI mode of the structure of this invention, as more practical operation, there is employed an approach to open the control electrodes 281, 291 to transfer signal charges of the storage electrodes 261, 271 to the CCD register 30 in which read-out operation of signals (signal charges) of one line has been completed thereafter to close the control electrodes 281, 291 to open the shift electrode 251 in the state where the shift electrode 241 is closed to transfer signal charges of the pixel train 181 to the portions below the memory electrodes 271 to subsequently to close the shift electrode 251 to open the shift electrodes 241, 231 to transfer signal charges of the pixel 151 to the portions below the memory electrode 261. Then, an approach is employed to close the shift electrode 241 thereafter to open the shift electrodes 231, 221 to transfer signal charges of the pixel 171 to the pixel 181. At time subsequent thereto, in a manner similar to the above, transfer operations of signal charges from the pixel 141 to the pixel 151, from the pixel 161 to the pixel 171, and from the pixel 131 to the pixel 141 are carried out to carry out movements of image of the object to respective corresponding pixels, thus to carry out the photoelectric conversion subsequent thereto.

At times subsequent thereto, the above-mentioned operation is repeated in order to carry out transfer of the TDI mode.

The advantages with this embodiment described above are as follows.

It is possible to collect information of the device isolation area between pixels of one pixel train by the second pixel train adjacent thereto. Thus, resolution can be improved.

Figure 2A:
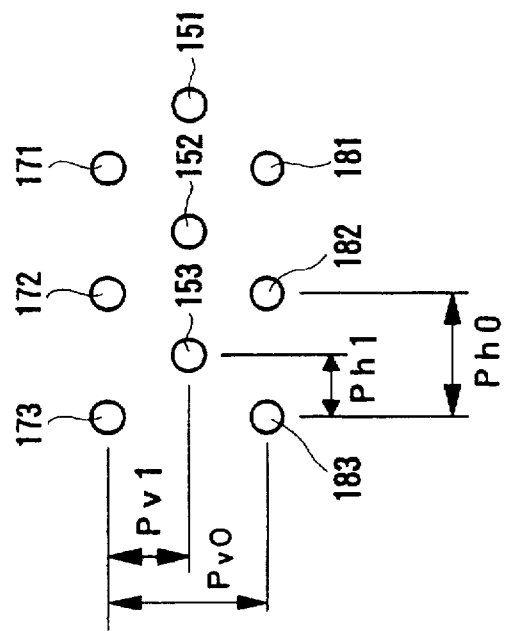
Figure 2A:
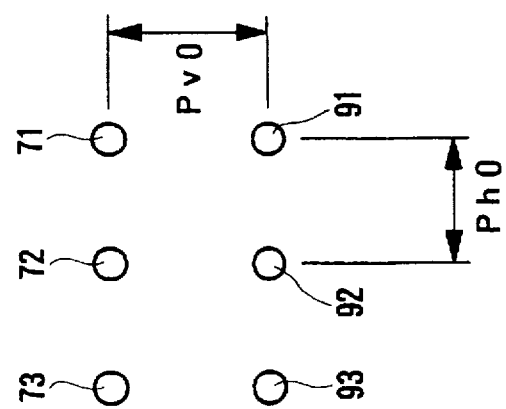
Figure 3:
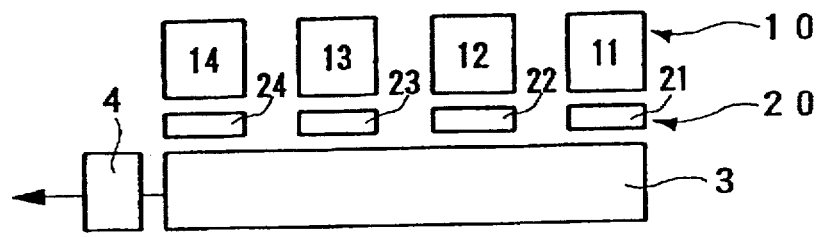
FIG. 3 is a model view showing the structure of a conventional solid-state imaging device of the single pixel train type.
Figure 4:
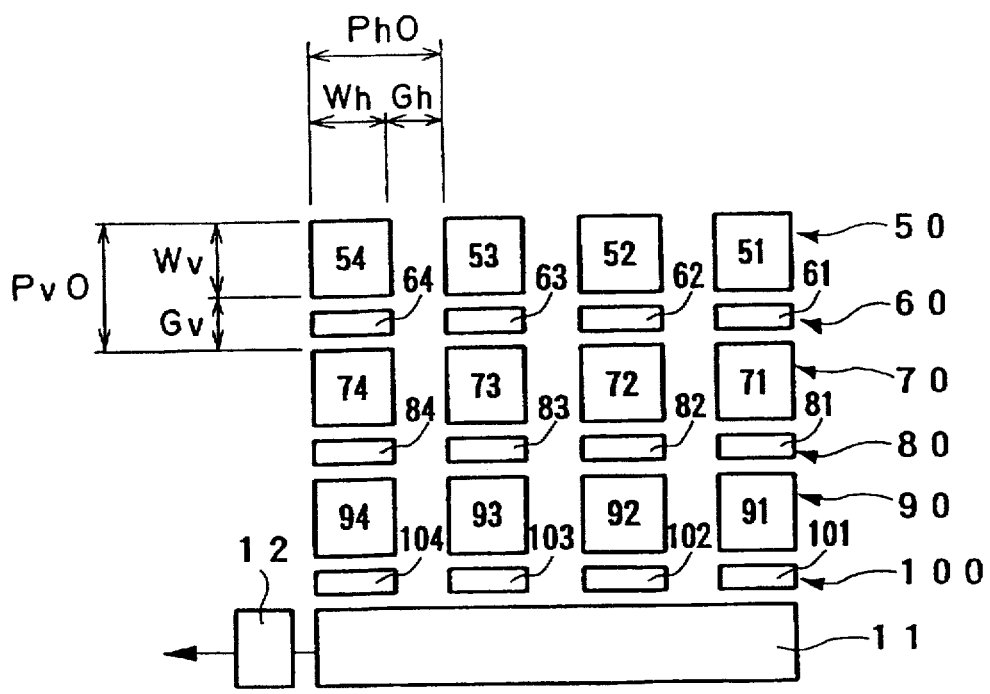
FIG. 4 is a model view showing the structure of a conventional TDI mode solid-state imaging device of the plural pixel train type.

FIG. 2 is a view for explaining the effect thereof in a manner of comparison with the prior art. In this figure, Ph0 is the conventional horizontal direction resolution pitch, Pv0 is the conventional vertical direction resolution pitch, Ph1 is the horizontal direction resolution pitch of this invention, and Pv1 is the vertical direction resolution pitch of this invention. As shown in FIG. 2A, in the conventional pixel arrangement, since pixels are not positionally shifted, it is impossible to read information between pixels. On the contrary, in the pixel arrangement of this invention shown in FIG. 2B, information between pixels can be collected by the adjacent pixel trains. Accordingly, by allowing the operation of the linear sensor to be synchronous with the scanning speed of the object, resolution can be improved so as to take a value twice greater than that of the conventional resolution.

Also with respect to the resolution in the vertical direction, since the adjacent pixel trains are shifted by half pitches, resolution can be improved so as take a value close to a value twice greater than the conventional resolution.

In addition, in this invention, since transfer in a meandering form is carried out in transfer between pixel trains, the stay time at the adjacent pixel trains is prolonged, thereby making it possible to broaden the width in the horizontal direction of the sensitivity distribution of pixels. For this reason, overlap of the foot (base) of the sensitivity curve between respective pixels takes place. As a result, more can be reduced.

In this invention, several modified examples may be employed. These modifications will be described below.

(1) While it has been described that there is employed the system of transferring signal charges of the pixel trains 150, 180 to the CCD shift register 30 to take out them as a single signal charge train in the time series manner from the output circuit to interpolate between pixels of the pixel train 150 by pixels of the pixel train 180, the pixel train 150 and the pixel train 180 may be used so as to obtain independent signal charge trains in this invention. Namely, in place of providing a single signal charge train by the pixel trains 150, 180, these pixel trains may be used so as to obtain individual (independent) two signal charge trains to record those signal charge trains in correspondence with the pixel arrangement. Also in this case, since the portion between pixels of the pixel train 150 is interpolated by the pixel train 180. Accordingly, the resolution in the horizontal direction remains to be high. In addition, by independently carrying out read-out/recording operations, the resolution in the vertical direction is also maintained so that it is not degraded.

(2) There may be employed an approach in which horizontal CCD shift registers are provided in dependency upon respective pixel trains and the number of transfer stages to carry out read-out operation every respective pixel trains. Thus, the memory electrodes and the control electrode can be omitted.

(3) While it has been described that the numbers of the first and second pixel trains are respectively three (3), they may take an arbitrary number of trains, e.g., may be one trains, respectively.

(4) Combination of pixel trains and shift electrodes may be of the transfer electrode structure of CCD.

As described above, in accordance with this invention, signal insufficiency of the portions which cannot be covered by the respective first and second pixel trains within picture, i.e., the portions corresponding to the device isolation regions relating to the horizontal direction and the vertical direction is compensated by respective adjacent pixel trains. Accordingly, improvement in the resolution can be made. In addition, since transfer between pixels is carried out in a meandering form, moire phenomenon can be reduced.

What is claimed is:

1. A solid-sate imaging device comprising:

first pixel trains each comprised of n number of quadrangle pixels (n is an integer greater than 1), right and left angles thereof arranged in a first horizontal line;

second pixel trains each comprised of n number of quadrangle pixels, right and left angles thereof arranged in a second horizontal line, said pixel trains disposed in a state respectively shifted by half pitches in a horizontal direction and in a vertical direction with respect to the first pixel trains;

a charge storage section for storing signal charges transferred to signal processing means;

first shift electrodes disposed between the i-th corresponding pixels (i=n−1) of the first and second pixel trains and adapted for sequentially transferring signal charges produced therein; and second shift electrodes for transferring signal charges of the pixels of the final transfer stage of the first and second pixel trains to the charge storage section.

2. A solid-state imaging device as set forth in claim 1, wherein the charge storage section has a capacity sufficient to store all of signal charges of both the first and second pixel trains.

3. A solid-state imaging device as set forth in claim 1, wherein the charge storage section comprises a first storage section for storing only signal charges corresponding to respective pixels constituting the first pixel trains, and a second storage section for storing only signal charges corresponding to respective pixels constituting the second pixel train.

4. A solid-state imaging device as set forth in claim 1, which further comprises a shift register for horizontally transferring signal charges stored in the charge storage section to an output section.

5. A solid-state imaging device as set forth in claim 4, wherein the signal processing means carries out processing on the basis of signal charges transferred by the shift register.

6. A solid-state imaging device as set forth in claim 5, wherein the signal processing means comprises separating means for separating one signal output of the first pixel train from the output of the second pixel train.

7. A solid-state device comprising:

a first pixel train comprised of n number of quadrangle pixels (n is an integer greater than 1), right and left angles thereof arranged in a first horizontal line;

a second pixel train comprised of n number of quadrangle pixels, right and left angles thereof arranged in a second horizontal line, said second pixel train disposed in a state respectively shifted by half pitches in a horizontal direction and in a vertical direction with respect to the first pixel train' a charge storage section for storing signal charges transferred to signal processing means; and shift electrodes adapted for sequentially transferring signal charges produced in the first and second pixel trains to the charge storage section.

8. A solid-state imaging device as set forth in claim 1, wherein said quadrangle pixels are square shaped.

9. A solid-state imaging device as set forth in claim 7, wherein said quadrangle pixels are square shaped.

* * * * *

UNITED STATES PATENT AND TRADEMARK OFFICE
CERTIFICATE OF CORRECTION

PATENT NO. : 5,793,071

DATED : August 11, 1998

INVENTOR(S) : Hirokazu SEKINE et al.

It is certified that error appears in the above-identified patent and that said Letters Patent is hereby corrected as shown below:

Claim 1, Col. 6, line 2, change "solid-sate" to --solid-state--.

Claim 7, Col. 6, line 56, change "train'" to --train;--

Signed and Sealed this

Twenty-ninth Day of June, 1999

Attest:

Attesting Officer

Q. TODD DICKINSON

Acting Commissioner of Patents and Trademarks